US008025733B2

(12) United States Patent
Keum et al.

(10) Patent No.: US 8,025,733 B2
(45) Date of Patent: Sep. 27, 2011

(54) HEATING CRUCIBLE AND DEPOSITION APPARATUS USING THE SAME

(75) Inventors: Ji Hwan Keum, Busan (KR); Chang Soon Ji, Ulsan (KR); Hyung Min Kim, Seoul (KR); Sung Tae Namgoong, Yangsan (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 1557 days.

(21) Appl. No.: 10/619,512

(22) Filed: Jul. 16, 2003

(65) Prior Publication Data

US 2004/0035366 A1 Feb. 26, 2004

(30) Foreign Application Priority Data

Jul. 23, 2002 (KR) .................. 10-2002-0043272

(51) Int. Cl.
 *C23C 14/00* (2006.01)
 *C23C 16/00* (2006.01)
(52) U.S. Cl. ......... 118/726; 118/663; 392/389; 219/634
(58) Field of Classification Search .................. 118/726, 118/663; 392/389; 219/634
 See application file for complete search history.

(56) References Cited

U.S. PATENT DOCUMENTS

| 2,793,609 | A | * | 5/1957 | Shen et al. ............... 118/726 |
| 2,799,764 | A | | 7/1957 | Chandler |
| 3,466,424 | A | * | 9/1969 | Adams .................. 392/389 |
| 3,842,241 | A | | 10/1974 | Isaacson et al. |
| 5,157,240 | A | | 10/1992 | Chow |
| 5,272,298 | A | * | 12/1993 | Taguchi et al. ............ 219/634 |
| 5,944,903 | A | | 8/1999 | Tiedje |
| 6,162,300 | A | | 12/2000 | Bichrt |
| 6,202,591 | B1 | | 3/2001 | Witzman et al. |
| 6,237,529 | B1 | * | 5/2001 | Spahn ..................... 118/726 |
| 6,242,719 | B1 | | 6/2001 | Kano et al. |
| 6,358,466 | B1 | | 3/2002 | Besser et al. |
| 2001/0008121 | A1 | * | 7/2001 | Tanabe et al. ............. 118/663 |
| 2003/0101937 | A1 | * | 6/2003 | Van Slyke et al. ......... 118/726 |

FOREIGN PATENT DOCUMENTS

| CN | 1057492 A | 1/1992 |
| CN | 1103112 | 5/1995 |
| CN | 1104758 A | 7/1995 |
| CN | 1037701 C | 3/1998 |

(Continued)

OTHER PUBLICATIONS

Webster's Ninth New collegiate Dictionary, Merriam-Webster, 1986, p. 104.*

(Continued)

*Primary Examiner* — Ram N. Kackar
(74) *Attorney, Agent, or Firm* — Christie, Parker & Hale, LLP

(57) ABSTRACT

A deposition apparatus includes a vacuum chamber and a heating crucible. A substrate, on which deposition films are formed, is installed in the vacuum chamber. The heating crucible is installed opposite to the substrate so as to vaporize an organic compound. The heating crucible includes a main body and an inner plate. The main body includes a space which contains the organic compound and a nozzle through which the organic compound that is vaporized is discharged. The inner plate is installed within the main body and includes at least one opening formed around an edge of an area facing the nozzle, so as to transmit the vaporized organic compound.

23 Claims, 4 Drawing Sheets

FOREIGN PATENT DOCUMENTS

| | | | |
|---|---|---|---|
| CN | 1308145 | | 8/2001 |
| DE | 2612424 | * | 8/1977 |
| DE | 2612424 A1 | | 9/1977 |
| EP | 1318207 A1 | | 6/2003 |
| JP | 60-043480 | * | 3/1985 |
| JP | 60116772 | | 6/1985 |
| JP | 60-137896 | | 7/1985 |
| JP | 60-162771 | * | 8/1985 |
| JP | 61-132589 | * | 6/1986 |
| JP | 61-156809 | * | 7/1986 |
| JP | 61-163267 | * | 7/1986 |
| JP | 63-238264 | * | 10/1988 |
| JP | 02-247374 | * | 10/1990 |
| JP | 02-290963 | * | 11/1990 |
| JP | 5-339718 | | 12/1993 |
| JP | 10-195639 | | 7/1998 |
| JP | 2000-068055 | | 3/2000 |
| JP | 2000-160328 | | 6/2000 |
| KR | 2000-0054211 | | 9/2000 |
| WO | WO 02/18669 | * | 3/2002 |

OTHER PUBLICATIONS

Webster's New Word Dictionary, The World Publishing Co., 1972, p. 163.*

Webster's Ninth New Collegiate Dictionary, Merriam-Webster, 1986, pp. 551 and 1189.*

Abstract of Chinese Patent No. ZL 91104641.0.

Certificate of Patent for Invention issued by the Chinese Patent Office in Chinese Patent No. ZL03125515.9 on Feb. 4, 2009.

Certificate of Patent for Invention issued in corresponding Chinese Patent No. ZL03133181.5 dated Jul. 16, 2008.

* cited by examiner

HEATING CRUCIBLE AND DEPOSITION APPARATUS USING THE SAME

CROSS-REFERENCE TO RELATED APPLICATION

This application claims the benefit of Korean Patent Application No. 2002-43272, filed Jul. 23, 2002 in the Korean Intellectual Property Office, the disclosure of which is incorporated herein by reference.

BACKGROUND OF THE INVENTION

1. Field of the Invention

The present invention relates to a heating crucible and a vacuum deposition apparatus using the same, and more particularly, to a vacuum deposition apparatus using an improved heating crucible that prevents scattering of a vaporable material.

2. Description of the Related Art

An electroluminescent (EL) device, which is a spontaneous emission display panel, is attracting attention as a next-generation display panel. An EL device provides a wide viewing angle, an excellent contrast, and a fast response characteristic. EL devices are classified into an inorganic EL device and an organic EL device according to a material that forms an emitting layer thereof. An organic EL device provides high brightness, excellent driving voltage, and a fast response speed, and performs polychromy, compared to an inorganic EL device.

Generally, in an organic EL device, an anode layer of a predetermined pattern is formed on a substrate. Then, a hole transport layer, an emitting layer, an electron transport layer are sequentially formed on the anode layer. A cathode layer is formed on the electron transport layer so as to have cathodes orthogonal to the anode layer. The hole transport layer, the emitting layer, and the electron transport layer are thin organic films made of organic compounds.

To manufacture an organic EL device having such a structure, thin organic films, such as, the hole transport layer, the emitting layer, the electron transport layer, or the like, are formed using a deposition apparatus. The deposition apparatus includes a vacuum chamber whose internal pressure is controlled to be between $10^{-6}$ and $10^{-7}$ torr, a heating crucible that is installed opposite to a substrate within the vacuum chamber to contain an organic compound, and a heater that is installed at the heating crucible and heats and vaporizes the organic compound.

While it is preferable to have the organic compound vaporize into molecules during a deposition operation, a sudden vaporization may occur within the organic compound during the heating, resulting in the organic compound being vaporized in lumps.

Some of the problems caused by this lump-by-lump basis vaporization are as follows. During the deposition operation, a deposition lump may be attached to an opening of a deposition mask. Accordingly, a material is not deposited on a desired area. This problem continuously occurs unless the deposition mask is replaced, thus hindering a mass production. Also, the deposition material lump may be attached to the substrate, which decreases the evenness of a deposited film. Whereupon a portion of the substrate, on which the deposition material lump is deposited, appears dark upon image display. Furthermore, where a part of an organic compound lump is attached to a nozzle, the organic compound lump is continuously deposited and grown inside the nozzle, consequently blocking the nozzle of the deposition apparatus.

To solve the above problems, Korean Patent Publication No. 2000-54211 discloses a heating crucible for a vacuum deposition apparatus having a net-type curtain installed on an opening through which a heated and vaporized organic compound is discharged. However, the net-type curtain installed on the opening in the heating crucible prevents smooth heat conduction from a heater, such that a foreign material first vaporized from the heating crucible and then deposited on the net curtain is not smoothly vaporized. In addition, it is difficult to install the net curtain within the heating crucible.

A Japanese Patent Publication No. hei 10-195639 discloses a vaporization source having a vaporization crucible that contains an organic vaporization material. An orifice which controls the amount of vaporization of the organic material is installed within the vaporization crucible. Since an organic compound is heated by a heater installed over an outer circumferential surface of the disclosed heating crucible, the organic compound is not evenly heated. In addition, the organic compound cannot vaporize uniformly from the entire portion of the crucible.

A Japanese Patent Publication No. 2000-160328 discloses a heating crucible for evaporating an organic compound, including a main body which contains an organic compound, a heater which is installed around an outer circumferential surface of the heating crucible, and a heat shield layer which is installed around an outer circumferential surface of the heater. A Japanese Patent Publication No. 2000-68055 discloses a deposition source for an organic EL device.

SUMMARY OF THE INVENTION

Accordingly, it is an aspect of the present invention to provide a heating crucible in which although an organic compound may not vaporize into molecules during a vaporization of the organic compound, improper deposition of the organic compound on a substrate, due to a deposition of organic compound in lumps on a deposition mask and the substrate, is prevented, and a deposition apparatus using the heating crucible.

Another aspect of the preset invention is to provide a heating crucible which prevents a formation of a dark image due to an emission failure of deposition films on a substrate of a display, and a deposition apparatus using the heating crucible.

Yet another aspect of the present invention is to provide a heating crucible which reduces improper deposition due to scattered organic compound lumps created by a sudden vaporization of the organic compound, and a deposition apparatus using the heating crucible.

Still another aspect of the present invention is to provide a heating crucible which prevents a reduction of energy due to severe collision among evaporating organic compound molecules, and a deposition apparatus using the heating crucible.

Additional aspects and/or advantages of the invention will be set forth in part in the description which follows and, in part, will be obvious from the description, or may be learned by practice of the invention.

To achieve the above and/or other aspects of the present invention, there is provided a heating crucible comprising a main body and an inner member. The main body includes a space which receives an organic compound and a nozzle through which vaporized organic compound is discharged. The inner member is installed within the main body and includes one or more openings formed around an edge of an area thereof facing the nozzle so as to transmit the vaporized organic compound.

The inner member may have a cross-section which is substantially the same as that of the space of the main body, and the openings may be continuously or discontinuously formed along the edge of the inner member. The sum of areas of the openings of the inner member may be equal to or greater than an area of the nozzle. The distance between the nozzle and the inner member may be from a radius of the nozzle to 9/10 of a distance between the nozzle and an inner bottom surface of the main body.

The main body may comprise a cap on which the nozzle is formed and a main body part in which the space is formed.

The heating crucible may further comprise a heater which is provided in the main body and/or the nozzle.

To achieve the above and/or other aspects of the present invention, there is provided a deposition apparatus for forming a deposition film on a substrate, comprising a vacuum chamber which receives the substrate and a heating crucible which is installed opposite to the substrate and vaporizes an organic compound provided thereto. The heating crucible comprises a main body having a space which receives the organic compound and a nozzle through which vaporized organic compound is discharged, and an inner member installed within the main body and having one or more openings formed around an edge of an area thereof facing the nozzle so as to transmit the vaporized organic compound.

In the present invention, a mask having a pattern to be deposited may closely attached to the substrate facing the heat crucible.

BRIEF DESCRIPTION OF THE DRAWINGS

These and/or other aspects and advantages of the invention will become apparent and more readily appreciated from the following description of the embodiments taken in conjunction with the accompanying drawings in which.

DETAILED DESCRIPTION OF THE EMBODIMENTS

Figure 1:
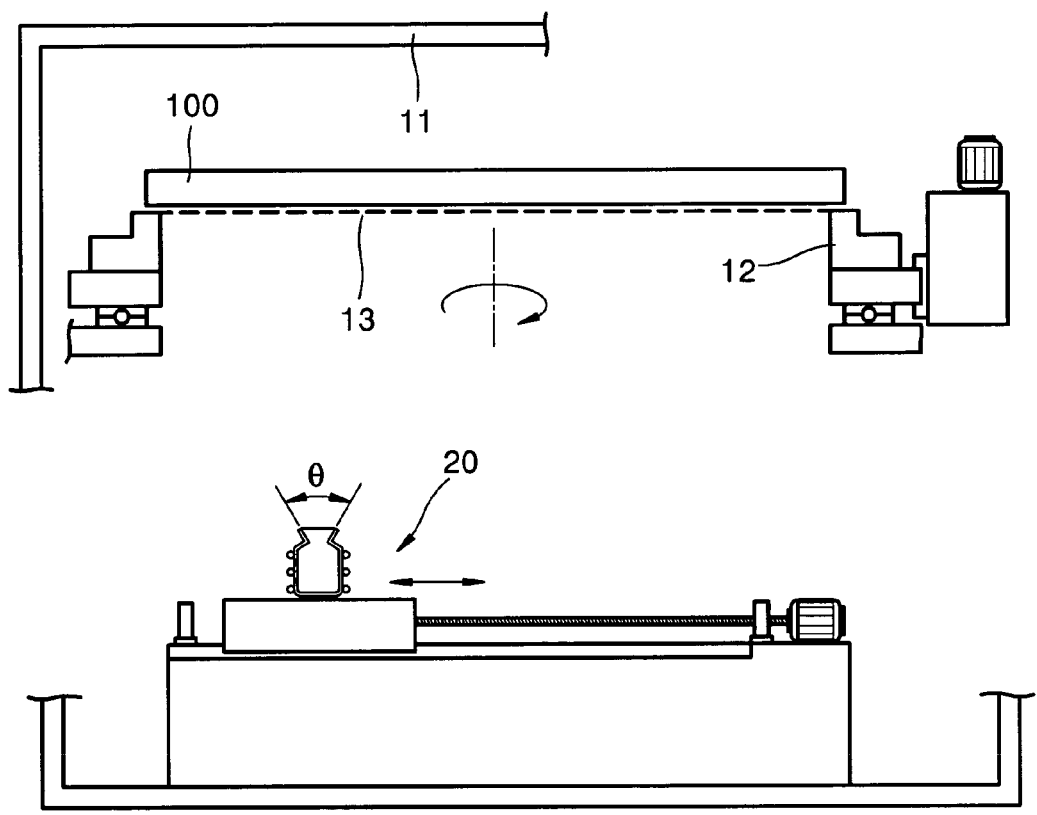
FIG. 1 is a schematic cross-sectional view of a vacuum deposition apparatus according to an embodiment of the present invention.

Reference will now be made in detail to the present preferred embodiments of the present invention, examples of which are illustrated in the accompanying drawings, wherein like reference numerals refer to the like elements throughout. The embodiments are described below in order to explain the present invention by referring to the figures.

FIG. 1 shows a vacuum deposition apparatus according to an embodiment of the present invention. The vacuum deposition apparatus includes a vacuum chamber 11, a substrate support 12 that is installed within the chamber 11 to support a deposition substrate 100, a deposition mask 13 that is closely attached to the substrate 100 and has, for example, a pattern of slots, and a heating crucible 20 that is installed opposite to the substrate 100 so as to position the deposition mask 13 between the heating crucible 20 and the substrate 100.

The substrate support 12 supports an edge of the substrate 100 so as to have a surface of the substrate, on which deposition is performed, face the heating crucible 20. However, the present invention is not limited to the above described structure. For example, the substrate support 12 may further include a unit which prevents the substrate 100 from bending due to its tare and a unit which closely adheres the deposition mask 13 to the substrate 100.

The heating crucible 20 vaporizes an organic compound provided therein so as to deposit the organic compound on the substrate 100 or the deposition mask 13, not in a form of lumps, but in molecules.

Figure 2:
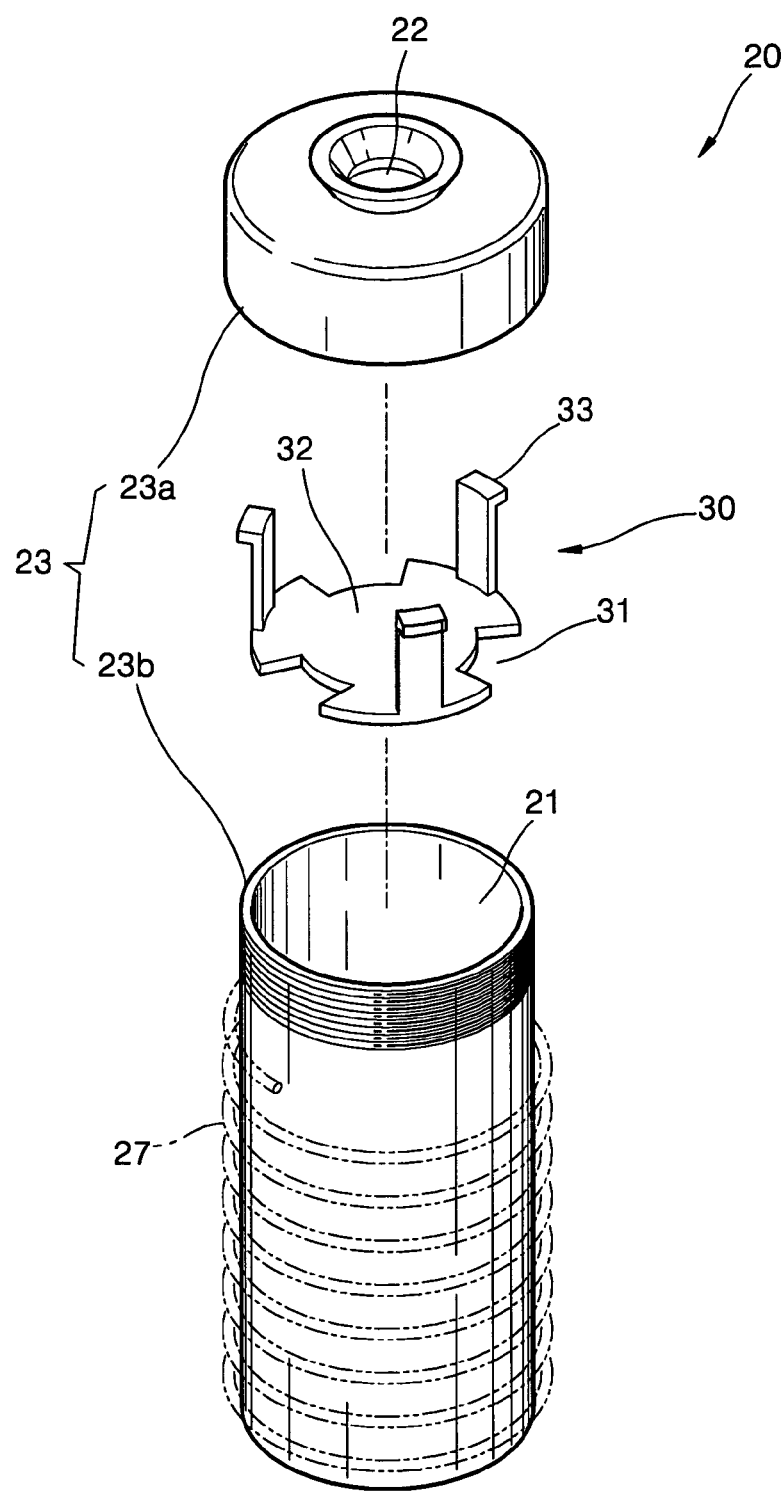
FIG. 2 is an exploded perspective view of a heating crucible according to an embodiment of the present invention.
Figure 3:
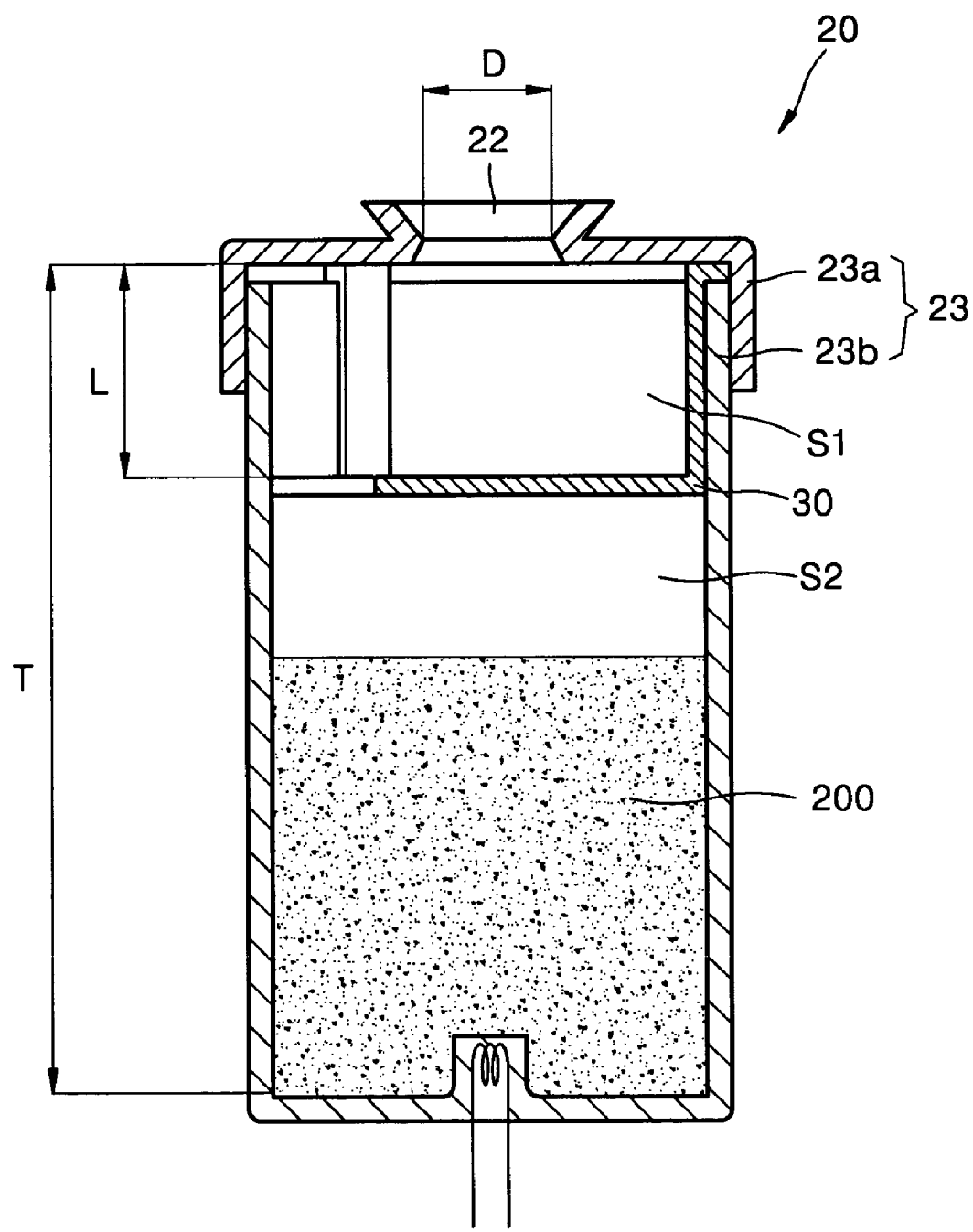
FIG. 3 is a cross-sectional view of the heating crucible of FIG. 2.

FIGS. 2 and 3 show an embodiment of the heating crucible 20. The heating crucible 20 includes a space 21 in which an organic compound 200 is contained, a main body 23 having a nozzle 22 through which an evaporated organic compound 200 is discharged, and an inner plate 30 that is installed within the main body 23 and has at least one opening 31. As shown in FIG. 2, the openings 31 are formed around an edge of an area facing the nozzle 22 so as to transmit a vaporized organic compound 200.

The main body 23 of the heating crucible 20 comprises a cap 23a which has the nozzle 22 formed in a centre thereof, and a main body part 23b which is coupled to the cap 23a and has the space 21. The main body part 23b may have a can shape, and may include a temperature sensing unit (not shown) on a bottom surface of the main body part 23b. The temperature sensing unit may be a thermocouple which measures a temperature of the vaporized organic compound 200. A heater 27 is installed around the main body part 23b. It is understood that the heater 27 can be installed independently of the main body part 23b. The nozzle 22 is installed in the centre of the cap 23a, and an auxiliary heater (not shown) can be installed on a portion of the cap 23a around the nozzle 22 so as to prevent the organic compound 200 from being deposited on the nozzle 22.

Figure 4:
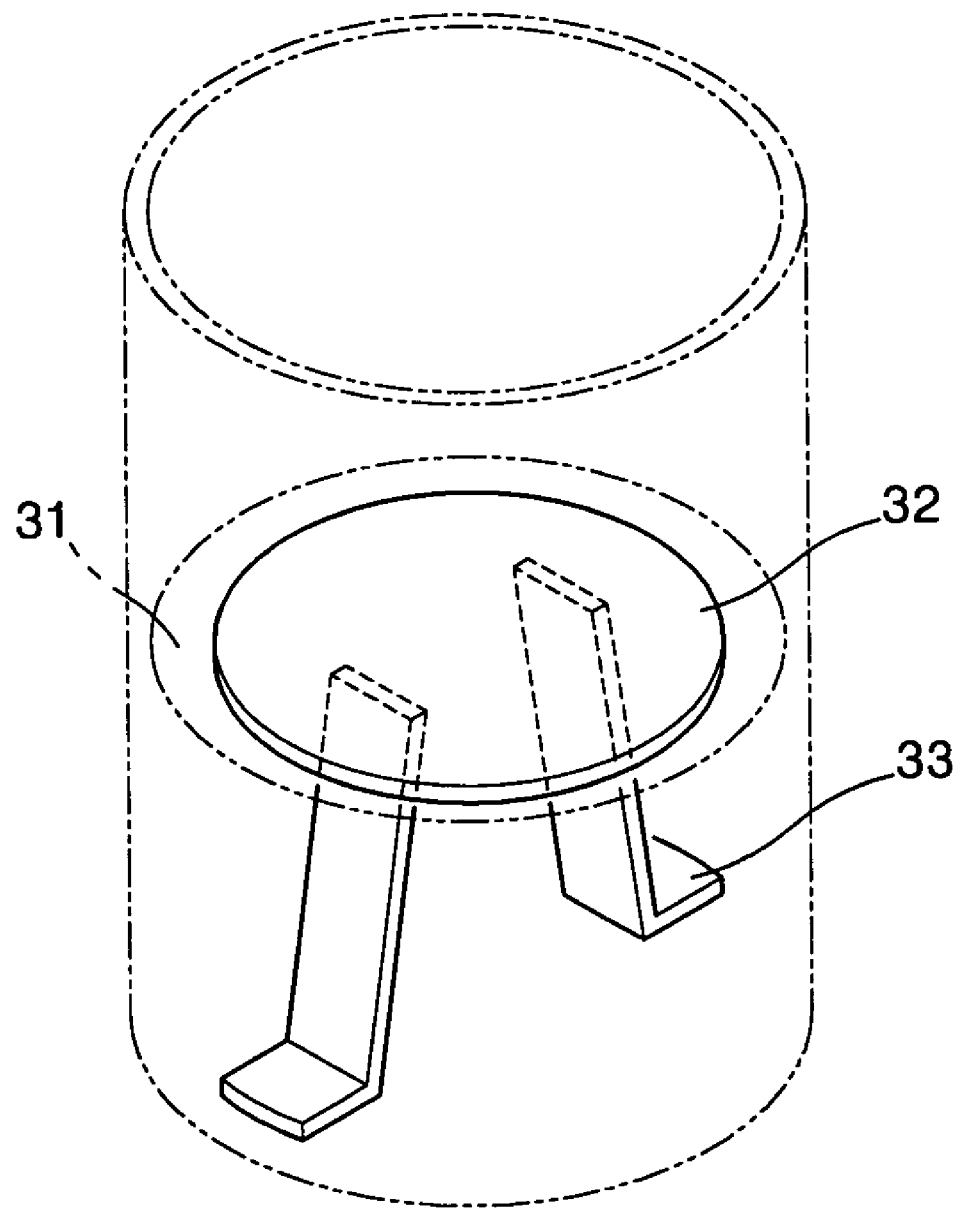
FIG. 4 is a perspective view of another embodiment of an inner plate of the deposition apparatus according to the present invention.

The inner plate 30 installed in the space 21 of the main body 23 includes a baffle board 32 on which at least one opening 31 is formed around an edge of an area corresponding to the nozzle 22, and at least one fixing portion 33 which extends upward from the baffle board 32 to support the baffle board 32. The openings 31 can be continuously or discontinuously formed around the edge of the baffle board 32. For example, FIG. 4 shows that the openings 31 are linked together along the edge of the baffle board 32, and the fixing portion 33 extends downward from a bottom surface of the baffle board 32. Where the openings 31 are formed at predetermined intervals on the edge of the baffle board 32, such intervals may be equal to one another.

The inner plate 30, that is, the baffle board 32, may be as wide as or wider than the nozzle 22. The baffle board 32 may be narrower than a sectional area of the space 21, and the area of the opening 31 may be controlled so as to prevent a large pressure difference from being generated between upper and lower spaces S1 and S2 defined by the baffle board 32 of the space 21 (see FIG. 3).

Referring to FIG. 3, the distance (L) between the nozzle 22 and the inner plate 30 is from the radius (D/2) of the nozzle 22 to 9/10 of the distance (T) between the nozzle 22 and an inner bottom surface of the main body 23.

An operation of a heating crucible 20 having the above-described configuration and a deposition apparatus adopting the heating crucible 20 will now be described. For example, an organic compound 200 to form a deposited thin film (that is, an electron transport layer, an emitting layer, or a hole transport layer), which is an organic film of an organic electroluminescent display device, is injected into the space 21 within the heating crucible 20. In this state, a predetermined voltage is applied to the heater 27 and the auxiliary heater (not shown) to heat the main body 32 to vaporize the organic compound 200.

During the vaporization of the organic compound 200, where sudden vaporization of the organic compound 200 occurs within the space 21 of the main body 23, the organic compound 200 vaporizes into molecule lumps. However, the inner plate 30 installed within the space 21 prevents the organic compound 200, evaporated in a form of lumps, from being deposited on the substrate 100 or the deposition mask 13, via the nozzle 22. That is, although the evaporated organic compound lumps are lead to be discharged to the nozzle 22, via the openings 31, the baffle board 32 installed to face the nozzle 22 blocks the evaporated organic compound lumps. Consequently, the evaporated organic compound lumps are not transmitted by the nozzle 22. Even where the organic compound lumps pass through the opening 31, since a vertical axis of the nozzle 21 does not match with that of the opening 31, the organic compound lumps collide with an inner wall of the space 21 defined by the main body part 23b and the cap 23a. Consequently, the organic compound lumps fail to pass through the nozzle 22.

Since the sum of areas of the openings 31 formed around the edge of the baffle board 32 facing the nozzle 22 is greater than the area of the nozzle 22, a reduction of pressure of the organic compound 200 discharged through the nozzle 22 can be avoided. Where the sum of the areas of the openings 31 is smaller than the area of the nozzle 22, the vaporized organic compound collides with one another by failing to move from the lower space S2 to the upper space S1, and the pressure of the lower space S2 increases. Where the pressure of the lower space S2 increases, a vaporization temperature of the organic compound 200 increases. As the vaporization temperature of the organic compound 200 is equal to or greater than a decomposition temperature, the organic compound 200 is decomposed. The decomposition of the organic compound 200 negatively affects deposition films and serves as an important factor of shortening the durability of an organic electroluminescent display device.

The location of the inner plate 30 within the space 21 is an important factor as it affects the amount of organic compound charged and the conductance of organic compound vapor molecules. Where the inner plate 30 is installed too low (based on a bottom of the main body part 23b), the amount of organic compound charged decreases and affects the effectiveness of the process. Where the inner plate 30 is installed too high, the volume of the upper space S1 is reduced, and accordingly, the conductance of the vapor molecules of the vaporized organic compound is reduced. Also, the collision of molecules becomes severe, such that the kinetic energy of the molecules is reduced. Due to the reduction of the kinetic energy, the organic compound molecules do not move freely and congeals and adheres to a relatively cooler surrounding place or adheres to a surrounding area of the nozzle 22. Accordingly, the distance (L) between the nozzle 22 and the inner plate 30 is from the radius (D/2) of the nozzle 22 to $9/10$ of the distance between the nozzle 22 and the inner bottom surface of the main body 23. Therefore, the nozzle 22 is prevented from being blocked by the organic compound 200.

According to an experiment of the inventors of the present invention, where an organic material was deposited on a substrate at 1 Å/s, and values obtained by dividing the distance (L) between the nozzle 22 and the inner plate 30 by the radius of the nozzle 22 were 0.40 and 0.67, the nozzle 22 was blocked by the organic material within 2 hours and 12 hours, respectively. Also, where a value obtained by dividing an installation height of the inner plate 30 by the radius of the nozzle 22 was equal to or greater than 1.0, the nozzle 22 was not blocked.

As described above, a deposition apparatus adopting a heating crucible according to the present invention can prevent an evaporation of organic compound lumps from being discharged through a nozzle. Accordingly, display of dark images due to deposition of organic compound lumps on a substrate is prevented. Furthermore, formation of a poor deposition pattern on a substrate, due to the deposition of organic compound lumps on a deposition mask, is also prevented.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A heating crucible for a deposition apparatus, comprising:
    a main body having a space which receives an organic compound and a nozzle through which the organic compound, vaporized, is discharged, the nozzle being defined in an upper wall of the main body;
    fixing portions suspended from an inner wall of the main body;
    an inner member supported at positions along an outer circumference thereof by the fixing portions to face the nozzle, the inner member having one or more separate openings formed therein along the outer circumference thereof and between supporting positions of the fixing portions, borders of the openings being defined by separate notches in the outer circumference and the inner wall of the main body, so as to allow for a transmittance of the vaporized organic compound therethrough, wherein the upper wall is perpendicular to a transmission direction of the organic compound when the organic compound is transmitted through each of the openings.

2. The heating crucible of claim 1, wherein:
    the inner member further comprises a baffle board formed on an area that faces the nozzle, and
    the one or more openings are formed around an edge of the baffle board.

3. The heating crucible of claim 1, wherein the one or more openings are formed at regular intervals around an edge of the inner member.

4. The heating crucible of claim 1, wherein a sum of areas of the one or more openings of the inner member is equal to or greater than an area of the nozzle.

5. The heating crucible of claim 1, wherein a distance between the nozzle and the inner member is from a radius of the nozzle to $9/10$ of a distance between the nozzle and an inner bottom surface of the main body.

6. The heating crucible of claim 1, wherein the main body comprises a cap on which the nozzle is formed and a main body part in which the space is formed.

7. The heating crucible of claim 1, further comprising a heater which is provided to the main body and/or the nozzle.

8. The heating crucible of claim 1, further comprising a temperature sensing unit which senses a temperature of the organic compound.

9. The heating crucible of claim 1, wherein:
    the inner member further comprises a baffle board formed on an area that faces the nozzle, and
    the baffle board is narrower than a sectional area of the space.

10. The heating crucible of claim 1, wherein the one or more openings have a predetermined area so as to prevent a pressure difference between a space below the inner member and a space above the inner member.

11. The heating crucible of claim 1 wherein the nozzle has a vertical axis that does not match with that of the opening so as to prevent the organic compound, in a predetermined form, from being transmitted through the nozzle.

12. The heating crucible of claim 1, wherein: the inner member further comprises a baffle board formed on an area that faces the nozzle, and the baffle board blocks the organic compound, in a form of a lump, from being transmitted through the nozzle.

13. The heating crucible of claim 1, wherein the inner member has a cross-section that is substantially the same as that of the space of the main body.

14. A deposition apparatus for forming a deposition film on a substrate, comprising:
   a vacuum chamber which receives the substrate; and
   a heating crucible which is installed opposite to the substrate and vaporizes an organic compound provided thereto, wherein the heating crucible comprises:
   a main body having a space which receives the organic compound and a nozzle through which the organic compound, vaporized, is discharged, the nozzle being defined in an upper wall of the main body;
   fixing portions suspended from an inner wall of the main body;
   an inner member supported at positions along an outer circumference thereof by the fixing portions to face the nozzle, the inner member having one or more separate openings formed therein along the outer circumference thereof and between supporting positions of the fixing portions, borders of the openings being defined by separate notches in the outer circumference and the inner wall of the main body, so as to allow for a transmittance of the vaporized organic compound therethrough, wherein the upper wall is perpendicular to a transmission direction of the organic compound when the organic compound is transmitted through each of the openings.

15. The deposition apparatus of claim 14, wherein: the inner member further comprises a baffle board formed on an area that faces the nozzle, and the one or more openings are formed around an edge of the baffle board.

16. The deposition apparatus of claim 14, wherein a sum of areas of the one or more openings of the inner member is equal to or greater than an area of the nozzle.

17. The deposition apparatus of claim 14, wherein a distance between the nozzle and the inner member is from a radius of the nozzle and 9/10 of a distance between the nozzle and an inner bottom surface of the main body.

18. The deposition apparatus of claim 14, wherein the main body comprises a cap on which the nozzle is formed and a main body part in which the space is formed.

19. The deposition apparatus of claim 14, wherein the heating crucible further comprises a heater which is provided to the main body and/or the nozzle.

20. A method of producing an electroluminescent (EL) device having an organic compound, the method comprising:
   obtaining a substrate of the EL device;
   depositing a layer of the organic compound on the substrate using a deposition apparatus having a heating crucible including a main body which receives the organic compound, a nozzle defined in an upper wall of the main body, fixing portions suspended from an inner wall of the main body, and an inner member supported at positions along an outer circumference thereof by the fixing portions to face the nozzle, the inner member having one or more separate openings formed therein along the outer circumference thereof and between supporting positions of the fixing portions, borders of the openings being defined by separate notches in the outer circumference and the inner wall of the main body, so as to allow for a transmittance of the vaporized organic compound therethrough, wherein the upper wall is perpendicular to a transmission direction of the organic compound when the organic compound is transmitted through each of the openings; and
   deflecting the transmitted organic compound via the upper wall of the main body.

21. The method of claim 20, wherein the inner member prevents the organic compound, in a form of a lump, from being deposited on the substrate.

22. A heating crucible for a deposition apparatus, comprising:
   a main body having a space therein defined by a cylindrical wall and an upper wall which receives an organic compound and a nozzle through which the organic compound, vaporized, is discharged, the nozzle being defined in the upper wall of the main body;
   fixing portions suspended from an inner wall of the main body;
   a baffle board parallel with the upper wall, having one or more separate openings formed therein, that is supported by the fixing portions at positions along an outer circumference of the baffle board between the openings, borders of the openings being defined by notches in an outer edge of the baffle board and the cylindrical wall of the main body, so as to allow for a transmittance of the vaporized organic compound therethrough, wherein the upper wall is perpendicular to a transmission direction of the organic compound when the organic compound is transmitted through the one or more openings.

23. A deposition apparatus for forming a deposition film on a substrate, comprising:
   a vacuum chamber which receives the substrate; and
   a heating crucible which is installed opposite to the substrate and vaporizes an organic compound provided thereto, wherein the heating crucible comprises:
   a main body having a space therein defined by a cylindrical wall and an upper wall which receives the organic compound and a nozzle through which the organic compound, vaporized, is discharged, the nozzle being defined in the upper wall of the main body;
   fixing portions suspended from an inner wall of the main body;
   a baffle board parallel with the upper wall, having one or more separate openings formed therein, that is supported by the fixing portions at positions along an outer circumference of the baffle board between the openings, borders of the openings being defined by notches in an outer edge of the baffle board and the cylindrical wall of the main body, so as to allow for a transmittance of the vaporized organic compound therethrough, wherein the upper wall is perpendicular to a transmission direction of the organic compound when the organic compound is transmitted through the one or more openings.

* * * * *